United States Patent [19]

Sugimoto

[11] Patent Number: 5,986,891
[45] Date of Patent: Nov. 16, 1999

[54] CARD ADAPTER AND METHOD FOR CONNECTING AN IC CARD TO AN ELECTRONIC APPARATUS

[75] Inventor: Yasuki Sugimoto, Tokyo, Japan

[73] Assignee: Oki Electric Industry Co., Ltd., Tokyo, Japan

[21] Appl. No.: 09/025,299

[22] Filed: Feb. 18, 1998

[30] Foreign Application Priority Data

Feb. 24, 1997 [JP] Japan .................................. 9-039532

[51] Int. Cl.$^6$ .............................. H05K 1/14; H01R 13/62
[52] U.S. Cl. .......................... 361/737; 361/736; 361/740; 361/796; 361/801; 361/752; 439/62; 439/331
[58] Field of Search .................................. 361/684–686, 361/727, 728, 736, 737, 740, 741, 747, 752, 753, 784, 796, 801, 802; 235/483, 486, 492; 439/64, 62, 76, 78, 467, 331, 329, 330, 377, 260, 267, 638; 395/282, 284

[56] References Cited

U.S. PATENT DOCUMENTS

| | | | |
|---|---|---|---|
| 4,743,746 | 5/1988 | Murschall et al. ...................... | 235/486 |
| 5,402,095 | 3/1995 | Janniere .................................. | 235/441 |
| 5,603,629 | 2/1997 | DeFranse et al. ...................... | 439/331 |
| 5,673,180 | 9/1997 | Pernet .................................. | 361/737 X |
| 5,674,080 | 10/1997 | Takemura .................................. | 439/159 |

*Primary Examiner*—Leo P. Picard
*Assistant Examiner*—Jayprakash N. Gandhi
*Attorney, Agent, or Firm*—Venable Robert J. Frank

[57] ABSTRACT

A card adapter for insertion of an IC card in a card slot of a receiving member of an electronic apparatus. The IC card is provided with card contacts and the receiving member is provided with a receiving member connector. The card adapter includes a base on which the IC card is positioned with the card contacts in registration with an opening in the base, a circuit board having circuit board contacts and a circuit board connector, and a cover supported on the base. The circuit board contacts project through the opening in the base to make electrical contact with the card contacts and the circuit board connector is connectable to the receiving member connector. The cover movable to a closed position at which it encloses the IC card and exerts pressure on the card contacts to maintain good electrical contact with the circuit board contacts.

13 Claims, 12 Drawing Sheets

CARD ADAPTER AND METHOD FOR CONNECTING AN IC CARD TO AN ELECTRONIC APPARATUS

CROSS REFERENCES TO RELATED APPLICATIONS

Not Applicable.

BACKGROUND OF THE INVENTION

1. Field of the Invention

This invention relates to an adapter for inserting a card containing an integrated circuit into a card slot of an electronic apparatus such as a computer.

2. Description of the Related Art

The Personal Computer Memory Card International Association (PCMCIA), a group of manufacturers and vendors formed to promote a common standard for PC Card-based peripherals, has introduced a standard specifying the configuration of a PC card, the dimensions of a PCMCIA slot in the housing of a computer adapted to receive a PC card, and the configuration of a female connector inside the slot which is designed to hold a male connector located on one edge of the PC card. A card of this type can be installed directly in the card slot of a computer.

However, a card of the type provided with contacts on its surface (hereinafter called an IC card) is also in use, and installation of an IC card in a PCMCIA slot designed to receive a PC card requires a card adapter. An example of an IC card is the so-called "smart card".

A known card adapter consists of a base having contacts on one surface which engage contacts on a surface of the IC card when the IC card is placed on the base. In this known card adapter, a connector is provided on an edge of the base which connects with the connector inside a PCMCIA slot in the computer housing. The sum of the base thickness and the IC card thickness is limited by the height of the slot in the computer.

In operation, the card adapter is inserted in the slot in the computer housing so that the connector on the base engage the connector inside the slot. The IC card is then inserted in the slot so that it slides over the base until its contacts engage the contacts on the surface of the base thereby making electrical contact with the computer circuitry.

This known card adapter is susceptible to various electrical failures. For example, the card may be inadvertently touched because it is exposed in the region between the card adapter and the electronic apparatus. As a result, data being transferred between the card and the electronic apparatus may be lost or altered. Moreover, it is possible to withdraw the card from the card adapter during data transmission, and such exposure may result in the destruction of the integrated circuit embedded in the card.

Further, since insertion of the card into the card adapter is implemented by sliding the card on the base, the contacts on the card rub against the contacts on the base. Therefore, the contacts on the card and on the base tend to wear out quickly. Also, the contacts on the card cannot always be successfully connected with the contacts on the base because of dust which, during rubbing, adheres to the contacts. Another difficulty with the known card adapter is that the pressure between the contacts on the card and the contacts on the base is not stable because no means are provided for tightly connecting the card and base contacts. Consequently, successful connection of the card and base contacts cannot always be achieved. There is also the possibility that, since the base contacts are exposed and touched easily, they may be destroyed when the card adapter is not installed in the card slot.

BRIEF DESCRIPTION OF THE INVENTION

Accordingly, it is an object of the present invention to protect an IC card from destruction during data transmission.

Another object of the invention is to reliably connect the contacts on an IC card with contacts provided in the card adapter.

Still another object is to protect the contacts provided on a circuit board with the card adapter.

The present invention is a card adapter for inserting an IC card having electrical card contacts on a surface thereof into a card slot provided in an electronic apparatus. The card adapter comprises a base having an opening in a surface thereof a circuit board embedded within the base having circuit board contacts whim project through the opening in the base, and a cover attached to the base having open and closed positions. The circuit board contacts are electrically connected to a circuit board connector adapted for connection to a receiving member connector located within the card slot of the electronic apparatus.

With the cover in its open position, the IC card is placed on the surface of the base with its card contacts engaging the circuit board contacts. The cover is then moved to its closed position and the card adapter inserted in the card slot so that the circuit board connector makes electrical contact with the receiving member connector. Consequently, the contacts on the IC card are electrically connected to the electronic apparatus via the circuit board contacts, the circuit board connector and the receiving member connector.

In another embodiment of the invention, connection of the contacts on the IC card to the electronic apparatus is delayed for a predetermined interval just prior to engagement of the circuit board connector to the receiving member connector to permit transient voltages or other undesired signals to decay before the IC card contacts are connected to the electronic apparatus.

DETAILED DESCRIPTION OF THE PREFERRED EMBODIMENTS

Figure 14:
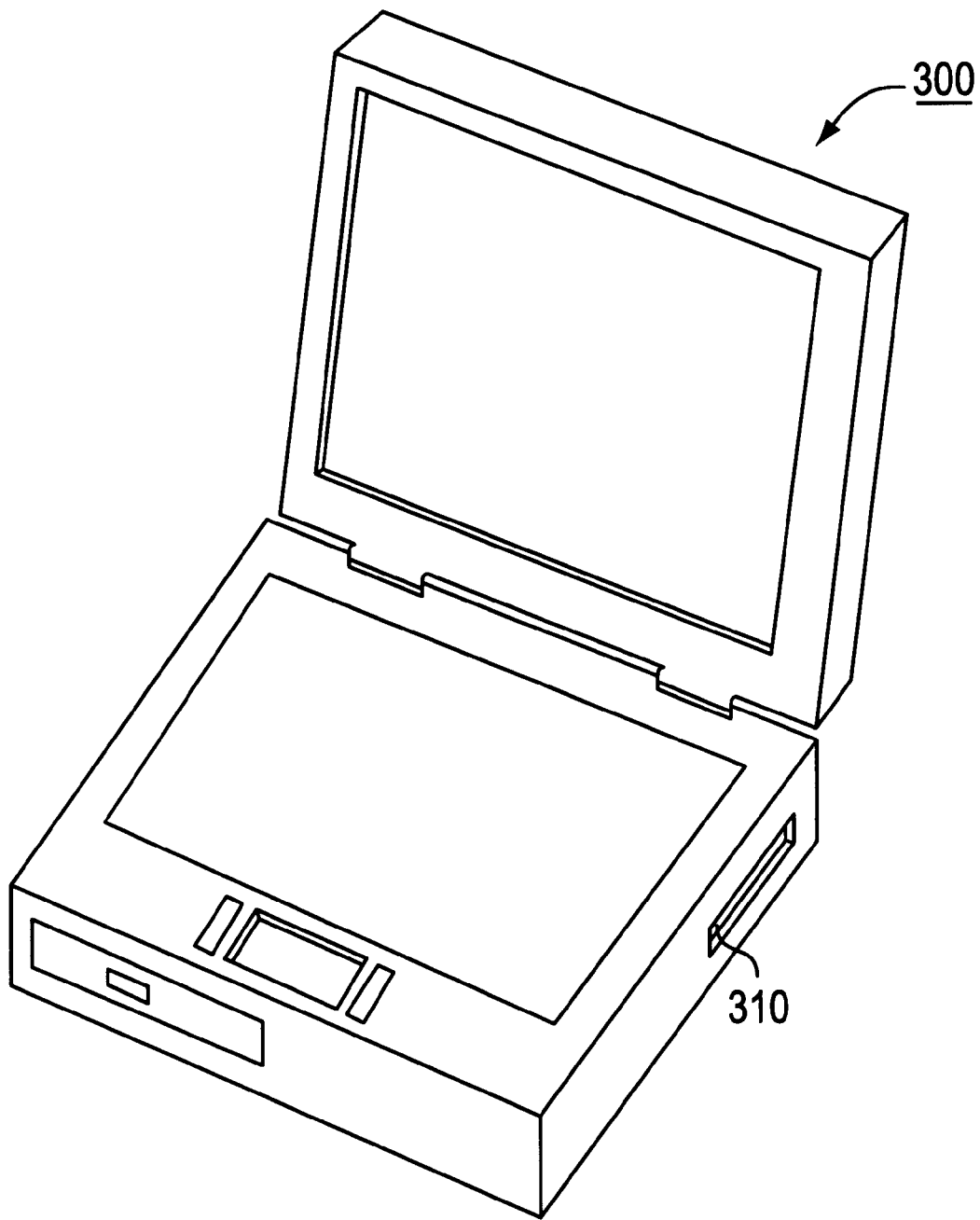
FIG. 14 shows a computer having a PCMCIA slot therein.

FIG. 14 is an illustration of an electronic apparatus 300, e.g. a personal computer, having a card slot 310 therein which conforms to the PCMCIA standard, and FIGS. 1, 2A, 2B, 3A, 3B, 4A, 4B, 5A and 5B depict a card adapter 100 designed to fit within the card slot 310. Refering to FIG. 1, the adapter 100 comprises a base 110 and a cover 130 shown in it open position, the cover being rotatably supported on the base 110 by a fulcrum 120. A circuit board 140 is embedded in the base 110 and provided with circuit board contacts 141 which project through an opening 110a in the surface 111 of the base 110. A block 112 is secured to one end of the base 110 adjacent the fulcrum 120, and a rib 113 is provided at each corner of the other end of the base.

Figure 1:
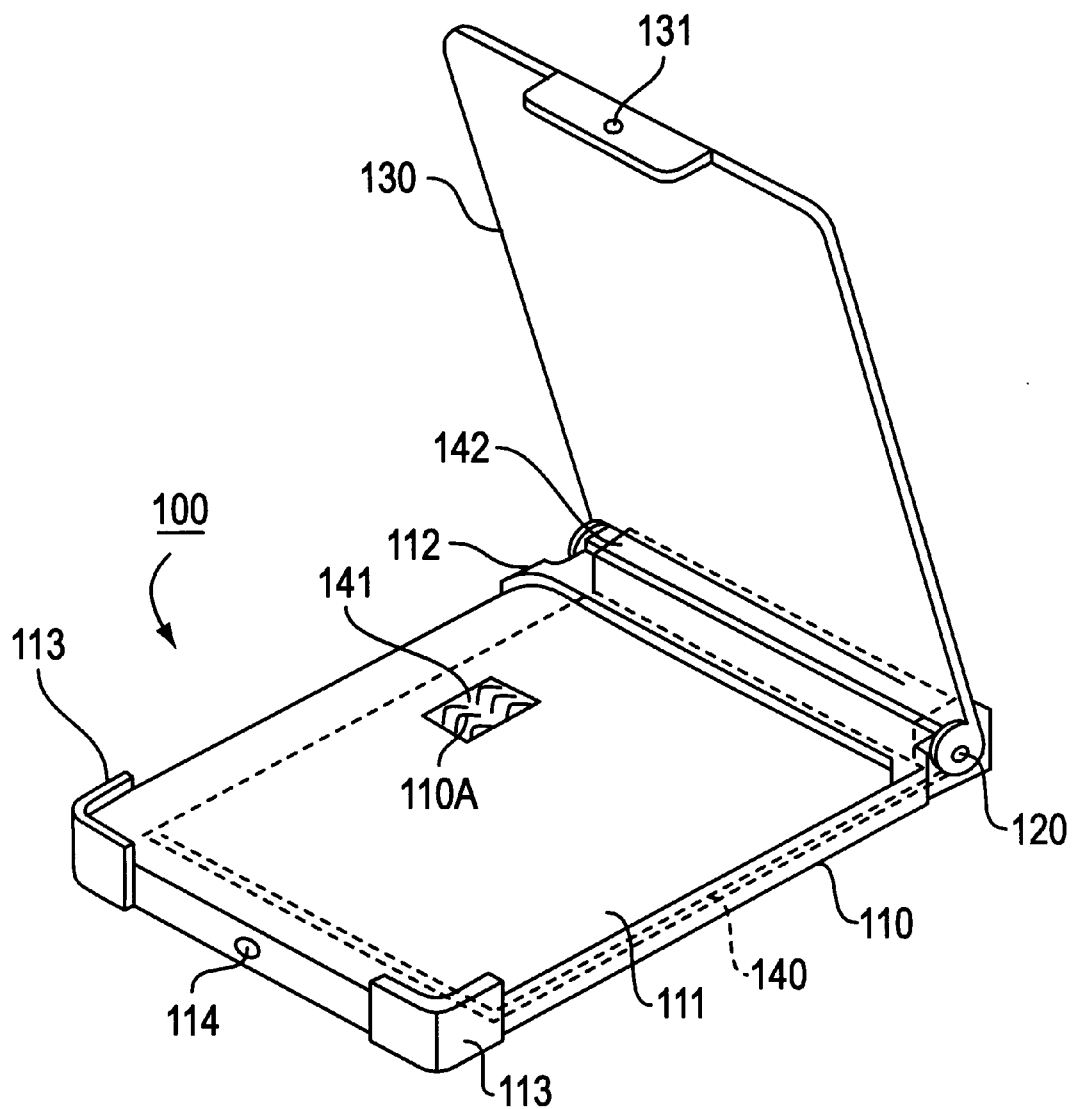
FIG. 1 is a perspective view of a card adapter of the present invention.
Figures 2A, 2B:
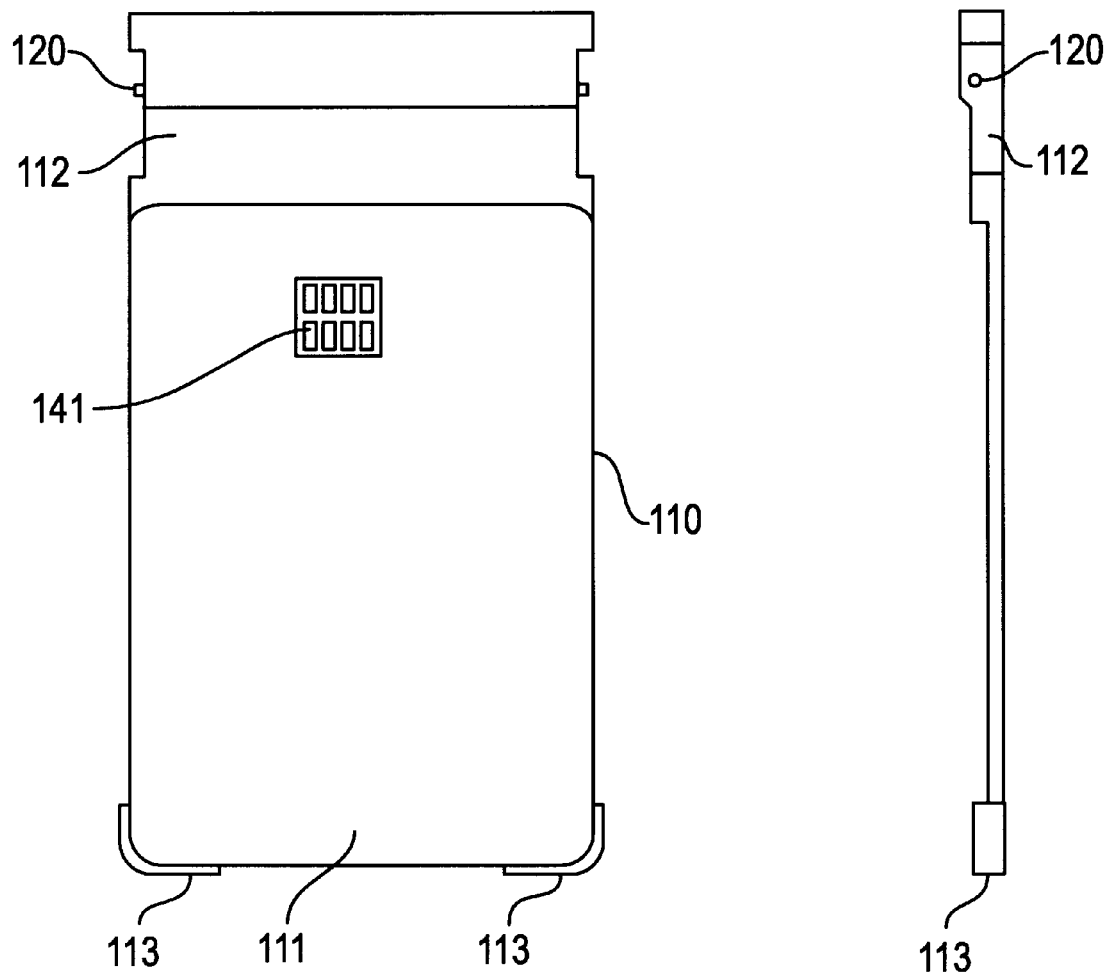
FIG. 2A is a plan view of a base of the card adapter of FIG. 1.
FIG. 2B is a side view thereof.
Figure 3A:
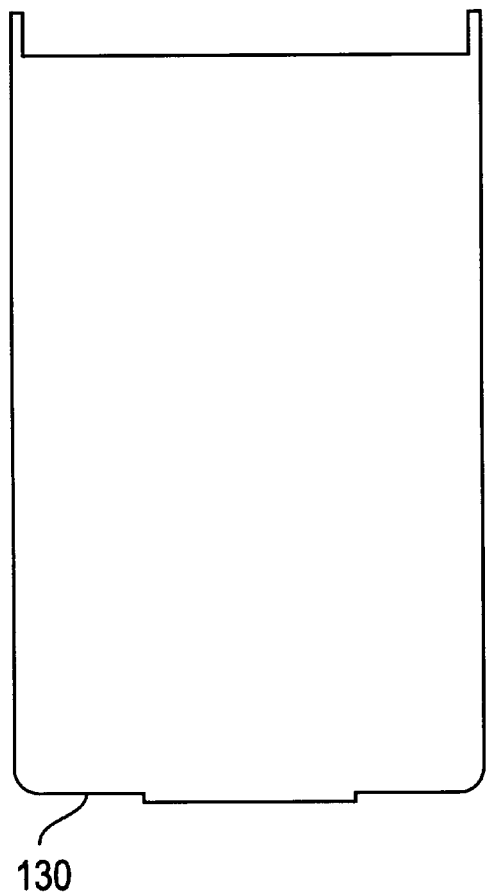
FIG. 3A is a plan view of a cover of the card adapter of FIG. 1.
Figure 3B:
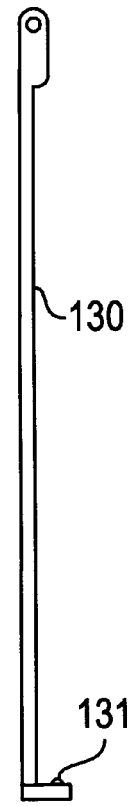
FIG. 3B is a side view thereof.
Figures 4A, 4B:
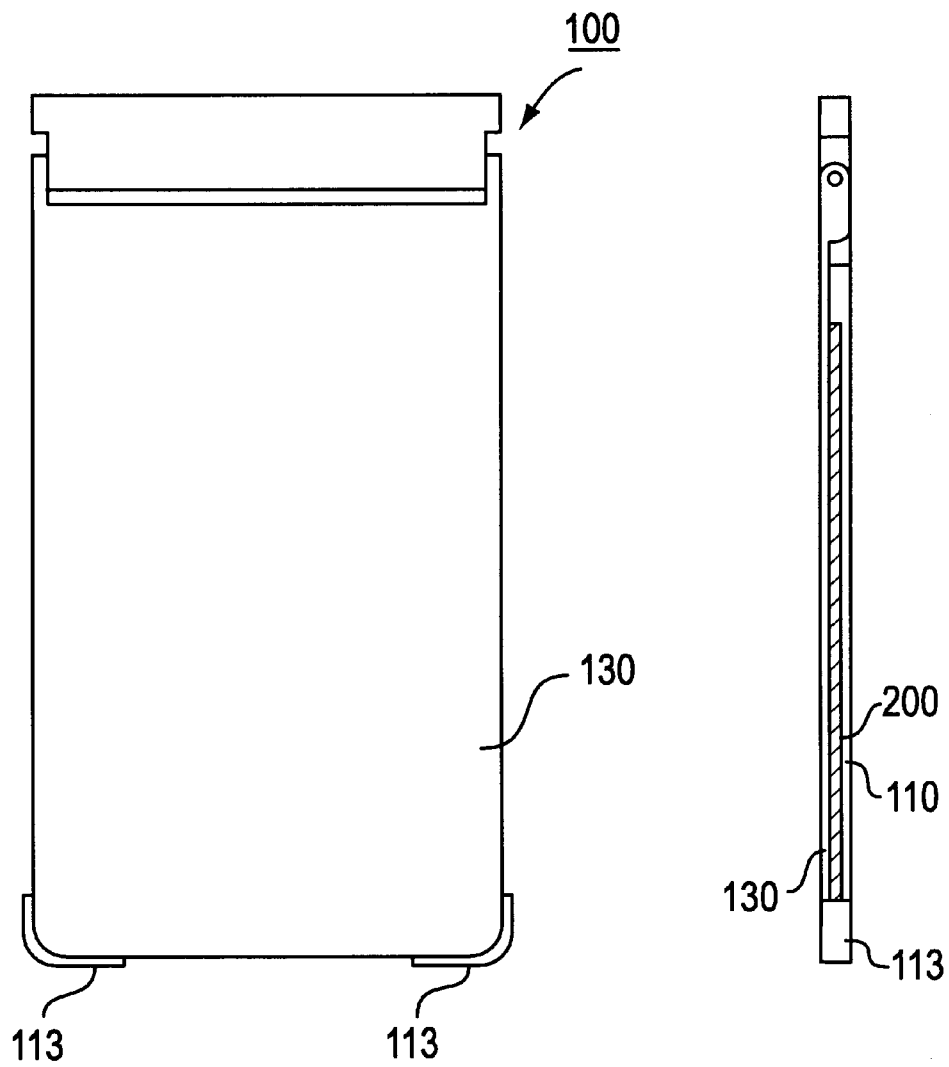
FIG. 4A is a plan view of the card adapter of FIG. 1 having an IC card mounted thereon.
FIG. 4B is A side view thereof.
Figure 5A:
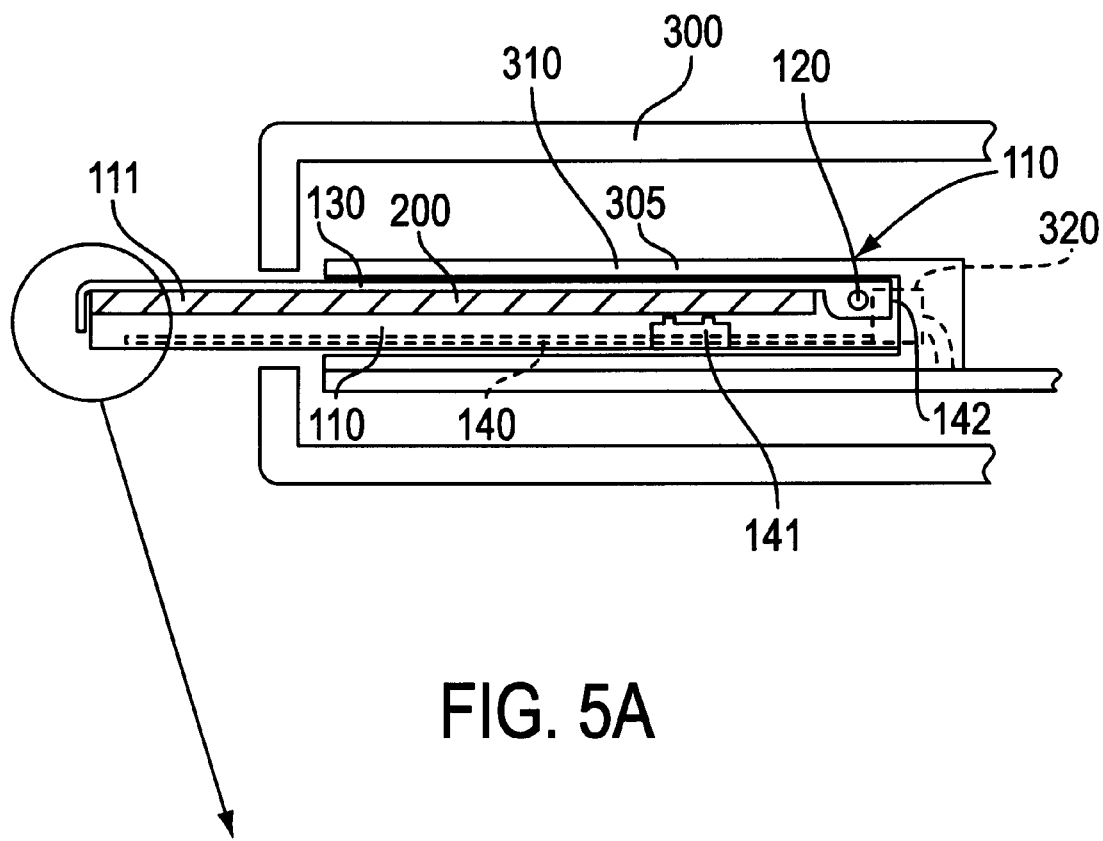
FIG. 5A is a side elevation of the card adapter of FIG. 1 having an IC card mounted thereon.
Figure 6:
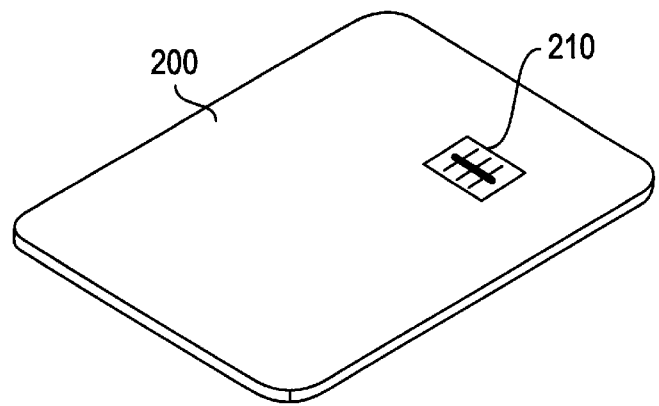
FIG. 6 is a perspective view of an IC card used with the card adapter of FIG. 1.

FIG. 5A shows the adapter 100 installed in the card slot 310 formed by a receiving member 305 (FIG. 7) of a computer. An IC card 200 having card contacts 210 (FIG. 6) on a surface thereof is placed on the surface 111 (FIG. 2A) of the base 110, one end of the card 200 being positioned by the block 112 and the other end of the card by the ribs 113. The ribs 113 are attached to the base 110 at locations that do not prevent insertion of the card adapter 100 into the slot 310.

Figure 5B:
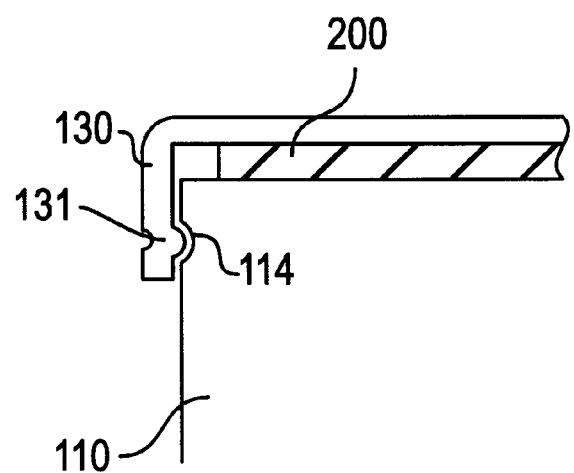
FIG. 5B is an enlarged detail of a lock mechanism of the card adapter of FIG. 1.

The width of the card adapter 100, including the fulcrum 120, is substantially the same as the width of the card 200. In addition, the surface 111 of the base 110 is approximately the same size as the surface of the IC card 200 that conforms to the ISO7816 standard authorized by the International Organization for Standardization. Referring to FIG. 5B, a concave portion 114 of the base 110 is provided on an edge thereof and a convex portion 131, which mates with the concave portion 114, is provided on the cover 130 for locking the cover to the base when the cover is in its closed position. The cover 130 is unlocked from the base 110 by rotating the convex portion 131 outward.

Figure 7:
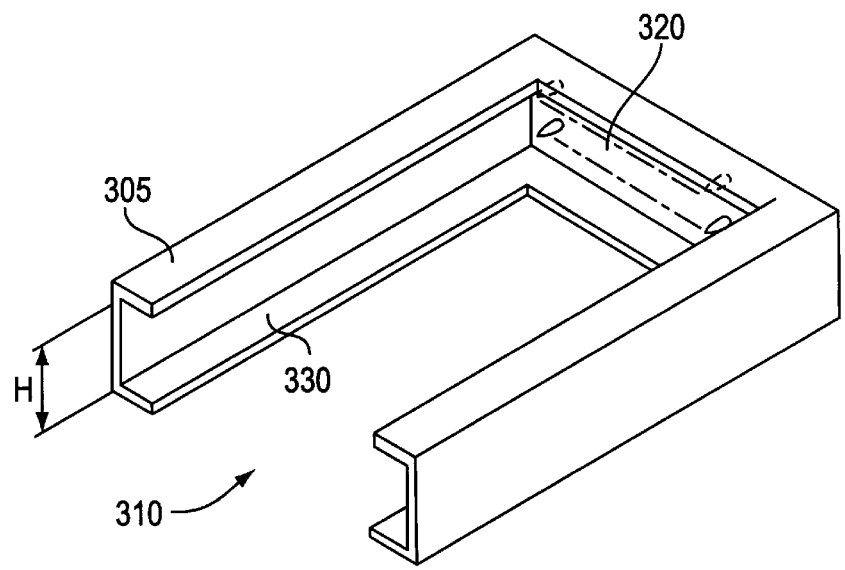
FIG. 7 is a perspective view of a receiving member for installation in an electronic apparatus for receiving the card adapter of FIG. 1.
Figure 7A:
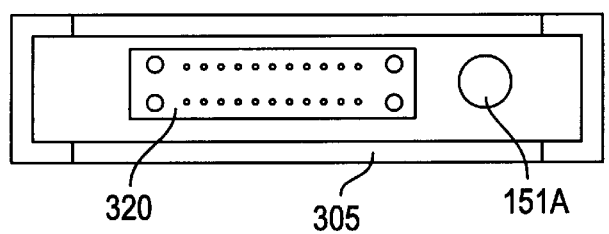
FIG. 7A is a front view of a receiving member connector located within the receiving member.
Figure 8:
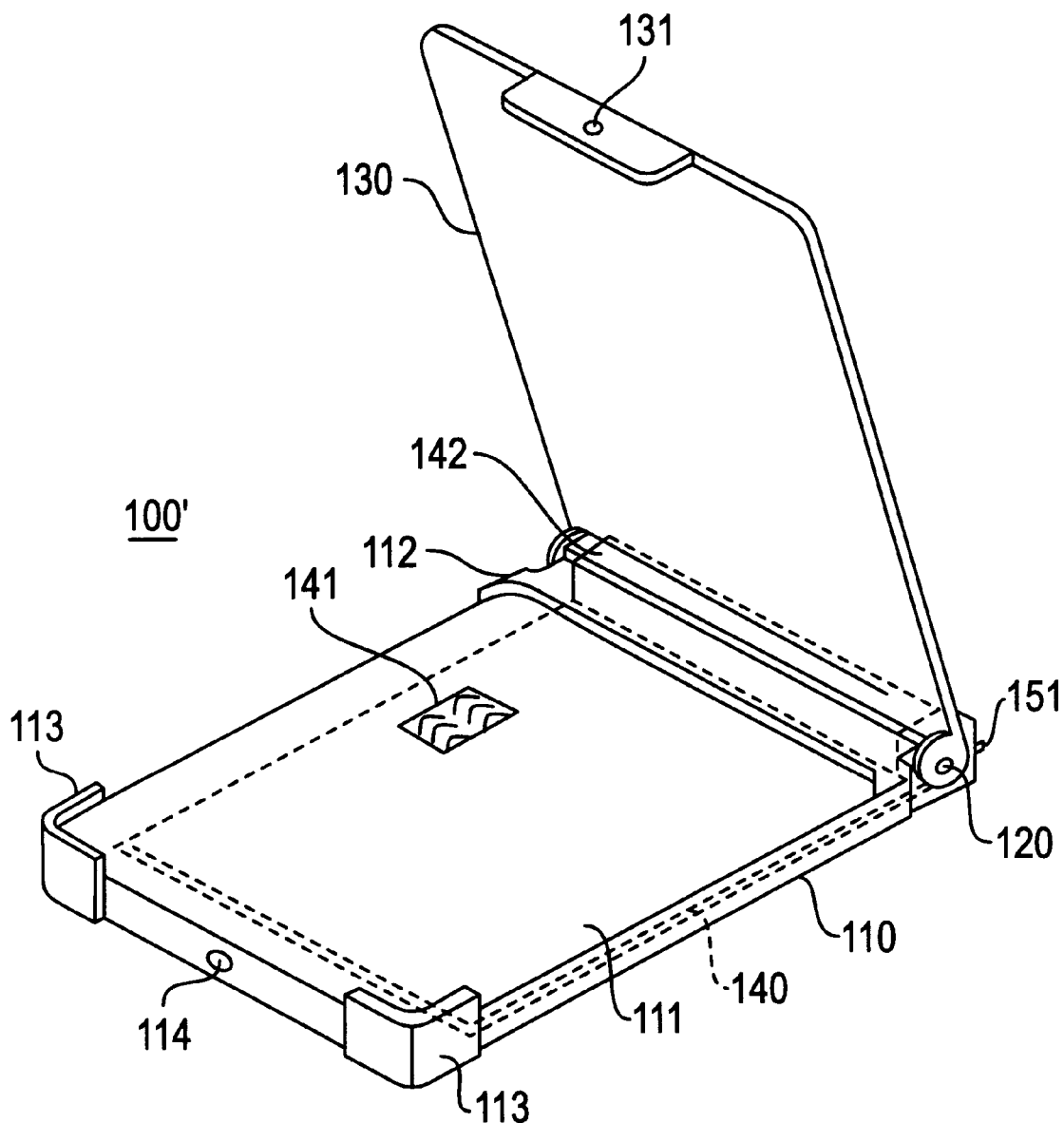
FIG. 8 is a perspective view of a second embodiment of the card adapter of the present invention.
Figure 9A:
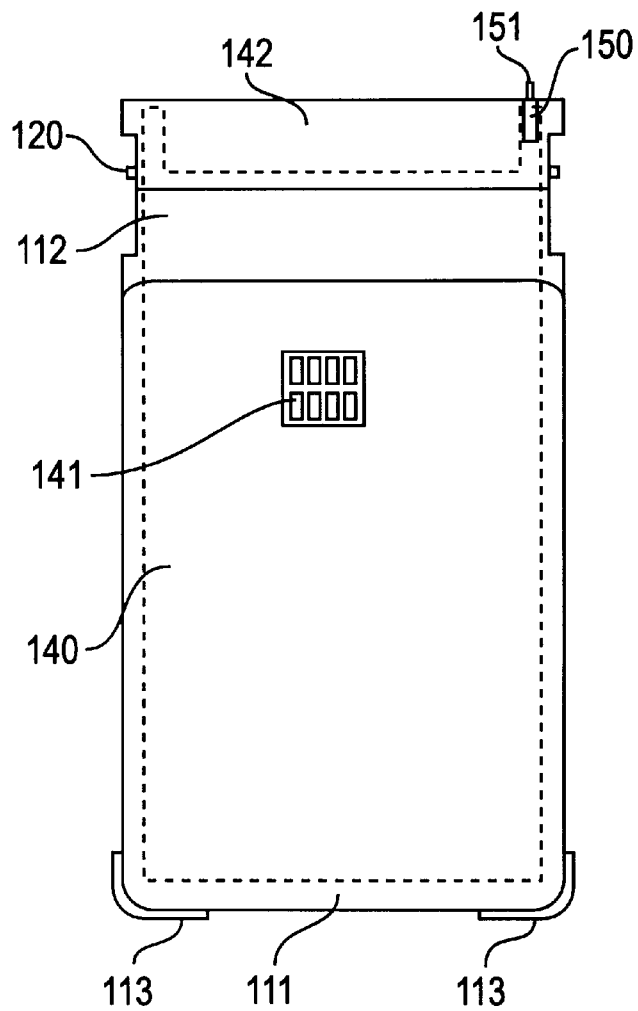
FIG. 9A is a plan view of a base of the card adapter of FIG. 8.
Figure 9B:
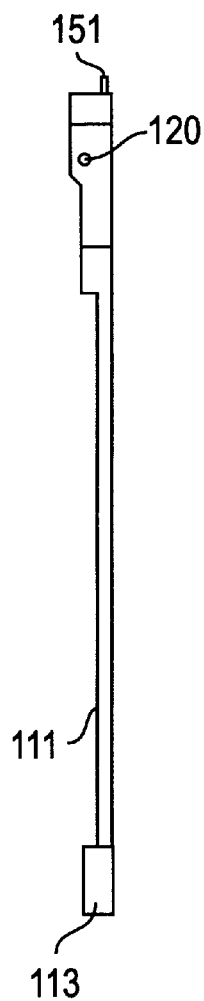
FIG. 9B is a side view thereof.
Figure 10:
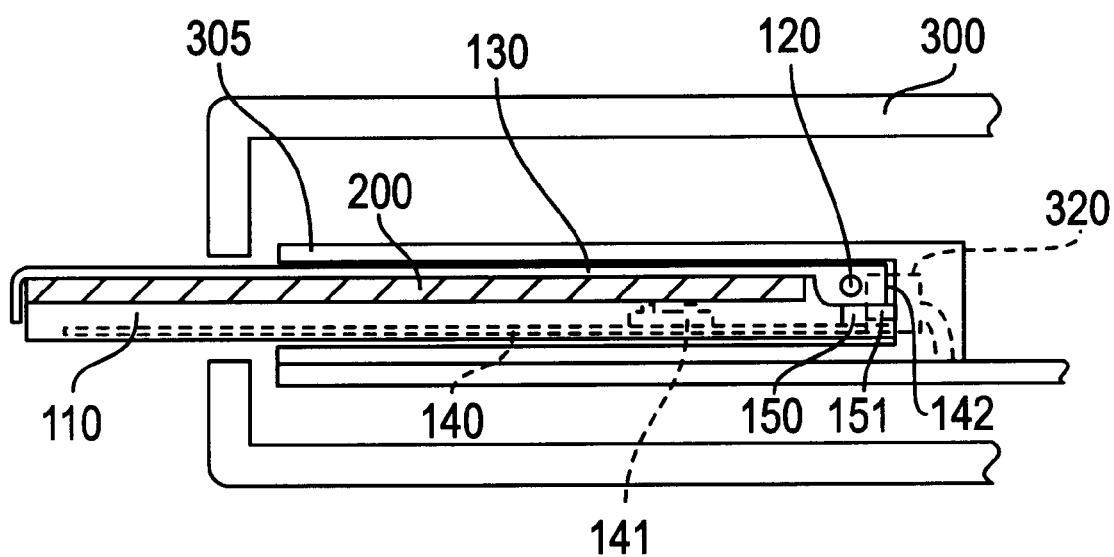
FIG. 10 is a side elevation view of the card adapter of FIG. 8.

The circuit board 140 has a connector 142 at the edge of the base 110 adjacent the fulcrum 120 for connection to a receiver connector 320 provided in the receiver member 305 as shown in FIGS. 7 and 7A The receiver member 305 comprises a guide 330 which forms the card slot 310. The card adapter 100 is inserted in the card slot 310 along the guide 330. The sum of the thickness of the cover 130, the thickness of the base 110 and the thickness of the card 200 is slightly less than the height of the card slot 310. That is, the thickness of the card adapter 100 including the IC card 200 is substantially the same as the thickness of the PC card specified by the PCMCIA. Further, although the thickness of the card adapter 100 in the present embodiment is conformed to the thickness of the PC card specified as Type 1, the thickness of the card adapter may be conformed to the thickness of the PC card specified as Type 2.

In operation, the cover 130 is opened exposing the circuit board contacts 141 which project from the surface 111 of the base 110. The card 200 is placed on the surface 111 of the base 110 between the block 112 and the ribs 113 thereby connecting the card contacts 210 to the circuit board contacts 141. The cover 130 is then closed, the convex portion 131 of the cover 130 fitting into the concave portion 114 of the base 110 thereby locking the cover in its closed position.

With the cover 130 closed, the card 200 is pressed toward the surface 111 of the base 110 thereby firmly connecting the card contacts 210 to the circuit board contacts 141. The card adapter 100 is then inserted into the card slot 310 so that the connector 142 of the circuit board 140 makes contact with the connector 320 of the receiving member 305 thereby electrically connecting the card 200 to the electronic apparatus 300 through the card adapter 100.

To remove the IC card 200 from the computer 300, the card adapter 100 is withdrawn from the receiver member 305 thereby disconnecting the connector 142 from the connector 320. The card 200 is removed from the card adapter 100 by disengaging the convex portion 131 of the cover from the concave portion 114 of the base 110, opening the cover 130 and removing the card.

As can be understood from the above description, the card 200 can not be inadvertently touched because it is covered by the cover 130 and therefore data transferred between the card 200 and the electronic apparatus 300 is protected. In addition, even card contacts which have become deformed can connect reliably to the circuit board contacts 142 because the deformed card is pressed against the surface 111 by the cover 130. Moreover, the circuit board contacts 141 are protected from damage because they are covered by the cover 130 even if the card 200 has not been placed on the base 110. Also, since the card 200 is secured to the surface 111 of the base 110 by the block 112 and the ribs 113, data is transferred reliably between the card and the electronic apparatus 300.

Another advantage of the invention is that the IC card 200 cannot be removed from the adapter 100 when the adapter is within the receiver member 305 because it is held therein by the cover 130 and ribs 113. Thus, the card 200 can not be withdrawn during transfer of data, and the cover 130 can not be opened when the card is inserted within the card slot 310 of the receiver member 305. In addition, the IC card contacts 210 do not rub against the circuit board contacts 141 because the card is only placed on the surface 111 when the card is inserted in the card adapter. Accordingly, the contacts 210 and 141 can be expected to have a long life. Also, the collection of dust on the card and circuit board contacts is minimized because of the closed environment for the contacts 210 and 141.

In a second embodiment of the invention, a card adapter 100' is provided with a detector switch 150 having an actuator button 151, as shown in FIGS. 8–13. The components of the second embodiment which correspond to those of the first embodiment are designated by the same numbers as those used in FIGS. 1–7.

Figure 11:
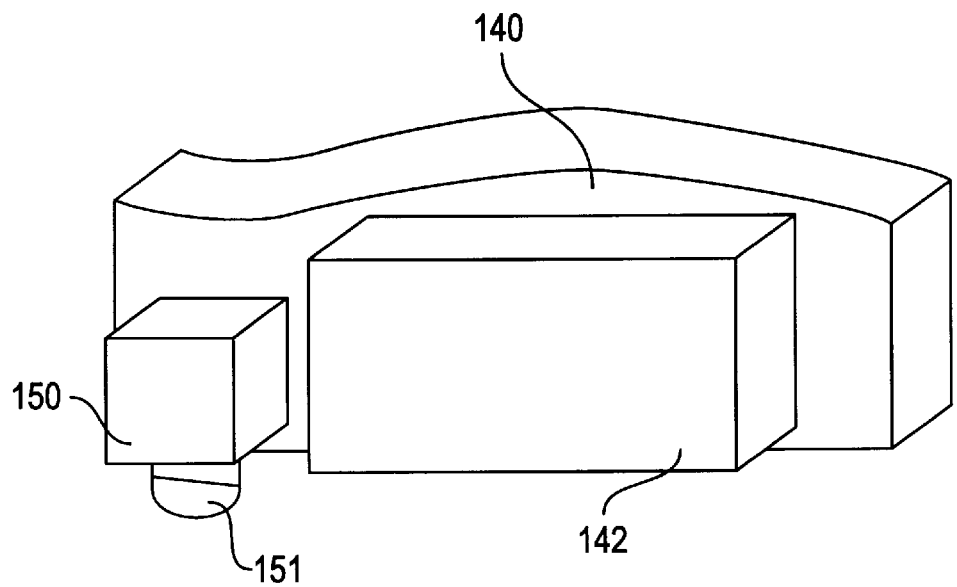
FIG. 11 is a schematic view showing an arrangement of a detector switch and a circuit board connector on a circuit board of the card adapter of FIG. 8.
Figure 13:
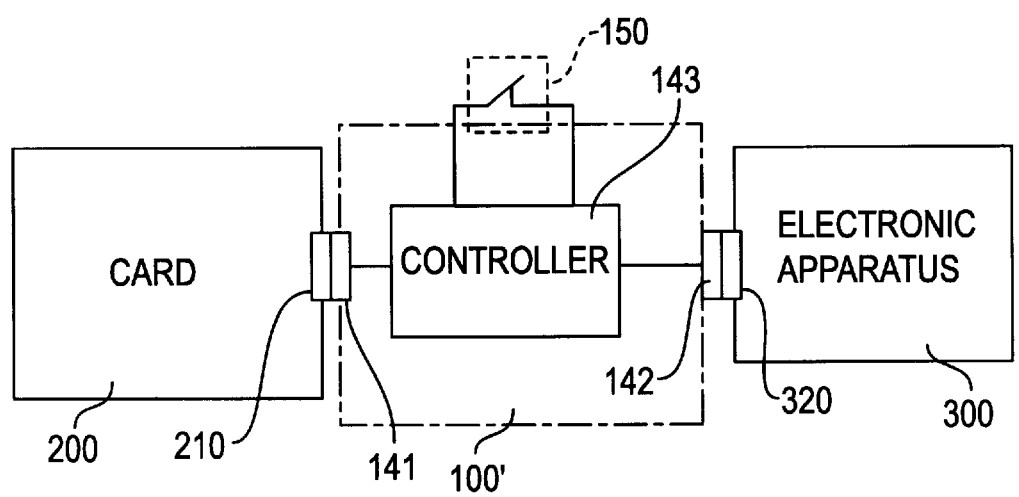
FIG. 13 is a block circuit diagram of the card adapter of the second embodiment of FIG. 8.

The detector switch 150 has contacts which are normally held open and which close only when the button 151 is depressed. The switch 150 is installed on the circuit board 140 at the edge of the base 110 adjacent the connector 142 (FIG. 11). When the card adapter 100' is inserted into the slot 310 of the card receiver 305, the button 151 strikes the card receiver 305 at a region indicated in FIG. 7A by a circle 151a adjacent the receiver member connector 320 thereby closing switch 150 and energizing a controller 143 (FIG. 13). Energizing the controller 143 starts a program which, after a predetermined time has elapsed, connects the contacts 210 of the card 200 to the connector 320 via circuit board contacts 141 and circuit board connector 142. The time delay between actuation of switch 150 and completion of the electrical connection ensures that any transient currents or electrical noise that may occur while the switch 150 is closing have decayed sufficiently so as not to affect the signals being transferred between the IC card 200 and the computer 300. When the card adapter 100' is withdrawn from the card slot 310 of the receiving member 305, the card contacts 210 are disconnected from the computer because the connector 142 is disconnected from the connector 320 and because the switch 150 is opened by release of the button 151 from the surface adjacent the connector 320.

Next, operation of the card adapter 100' will be explained. As in the first embodiment of the invention, printed circuit contacts 141 project from the surface 111 of the base 110 as is seen when the cover 130 is opened. The card 200 is placed on the surface 111 between the block 112 and the two ribs 113 thereby connecting the contacts 210 of the card 200 to the contacts 141 on the circuit board 140. The cover 130 is then closed and locked in position by engaging the convex portion 131 of the cover 130 with the concave portion 114 of the base 110. Next, the card adapter 100' containing the IC card 200 is inserted in the card slot 310. The height of the card slot 310 is slightly greater than the sum of the thickness of the cover 130, the thickness of the base 110 and the thickness of the card 200.

Figure 12A:
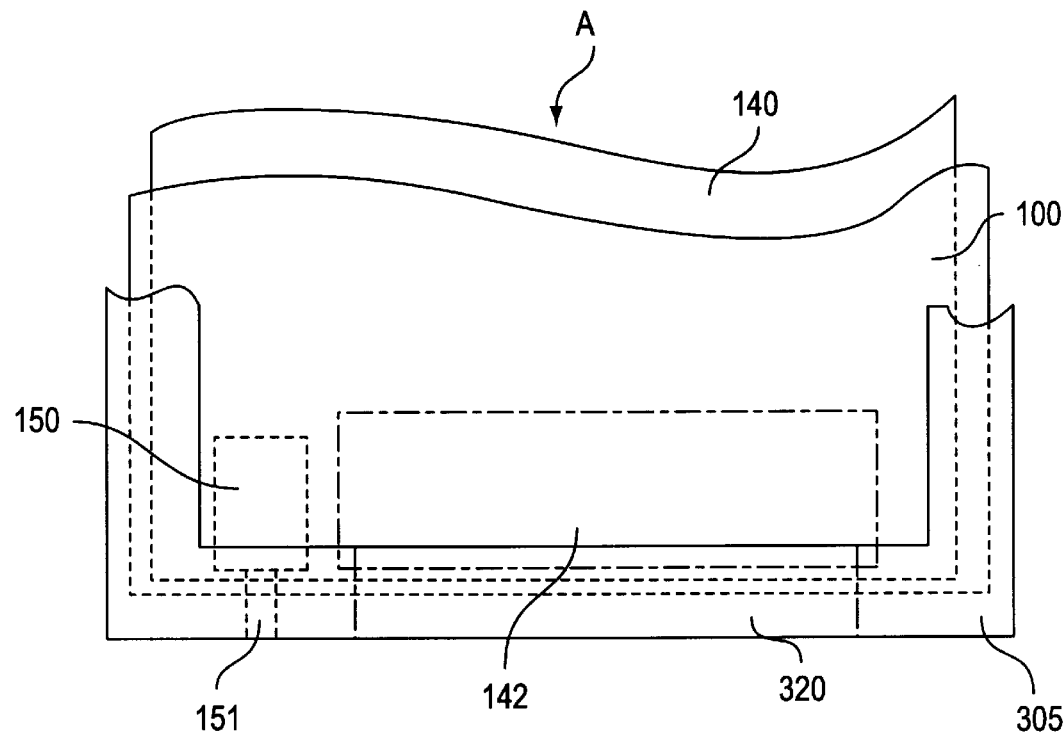
FIGS. 12A and 12B are schematic illustrations showing a button of the detector switch of FIG. 11 striking the receiving member connector of FIG. 7A.
Figure 12B:
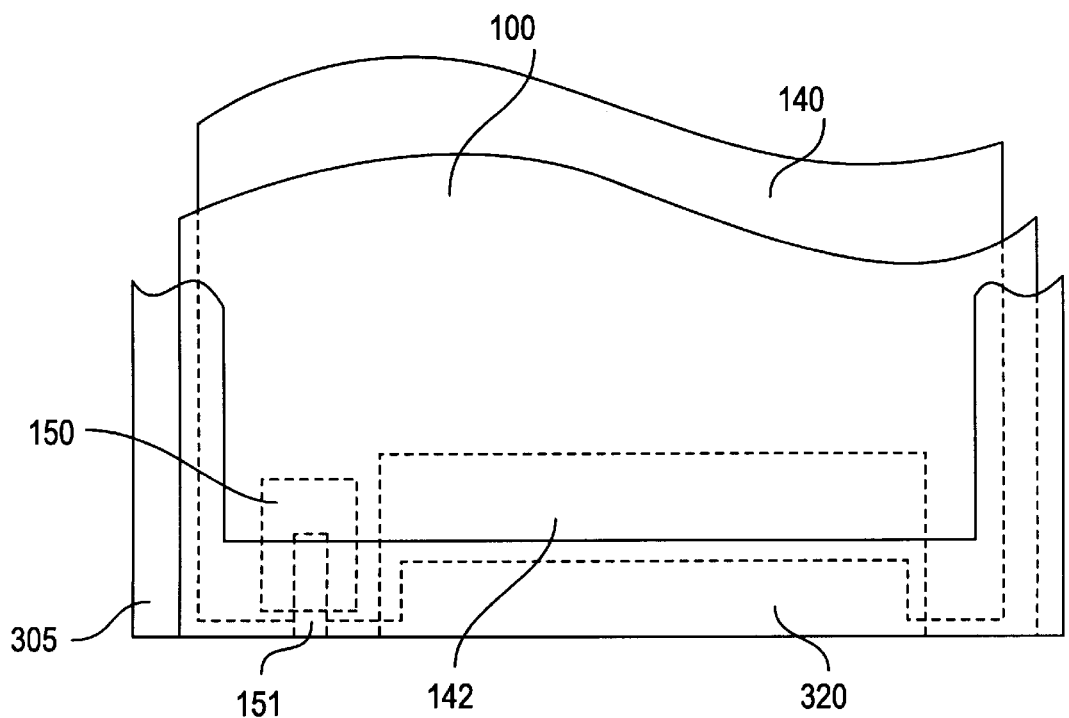

The card 200 is covered by the cover 130, and the contacts 210 of the card 200 are connected reliably to the contacts 141 of the circuit board 140 because the card 200 is pressed against the base 110 by the cover 130. When the adapter 100' is inserted in the slot 310 of the card receiver 305 in the direction of an arrow A, the circuit board connector 142 begins to engage the connector 320 (FIG. 12A). Then, the detector switch 150 is closed because the button 151 strikes the surface of the receiving member 305 adjacent the connector 320. When the card adapter 100' is completely inserted in the card slot 310, the connector 142 is connected electrically to the connector 320 (FIG. 12B). However, the contacts 210 are not connected electrically to the connector 320 upon the closing of the switch 150 but are connected only after a time delay programmed into the controller 143. In this way, the card 200 is protected against transients and other electrical noise because it is not connected electrically to the electronic apparatus 300 until after a predetermined delay.

To remove the card 200, the card adapter 100' is withdrawn from the card slot 310. At this time, the detector switch 150 is opened because the button 151 is no longer depressed and the circuit board connector 142 is still being disconnected from the connector 320. That is, the circuit board connector 142 is completely separated from the receiving member connector 320 after the switch 150 has opened. Thus, the card contacts 210 are not connected electrically to the circuit board connector 142 when the connector 142 is separating from the connector 320.

Therefore, the card 200 is protected against electrical noise because the card 200 is not connected electrically to the electronic apparatus 300 when the connector 142 begins to separate from the connector 320. After complete withdrawal of the card adapter 100', the cover 130 is opened by unfastening the convex portion 131 from the concave portion 140 and the card 200 removed from the card adapter 100'.

As many apparently widely different embodiments of this invention may be made without departing from the spirit and scope thereof, it is to be understood that the invention is not limited to the specific embodiments thereof except as defined in the appended claims.

I claim:

1. A card adapter for insertion of an IC card in a card slot of a receiving member of an electronic apparatus, said IC card having card contacts on a surface thereof and said receiving member have a receiving member connector therein, comprising:

a base having an opening in a surface thereof, the surface of said base being adapted for positioning the IC card thereon with the card contacts in registrations with said opening;

a circuit board having circuit board contacts and a circuit board connector, said circuit board contacts projecting through the opening in said base for making electrical contact with the card contacts on said IC card, and said circuit board connector being connectable to the receiving member connector;

a cover supported on said base, said cover being movable to a closed position wherein said cover encloses the IC card and exerts pressure on the card contacts to maintain good electrical contact with said circuit board contacts; and positioning means for positioning said IC card on the surface of said base.

2. A card adapter according to claim 1 wherein, when said cover is in the closed position, it covers the entire IC card.

3. A card adapter according to claim 1 further comprising a lock means for locking said cover in its closed position.

4. A card adapter according to claim 3 wherein said lock means comprises a concave portion provided on an edge of said base and a convex portion provided on said cover, said convex portion opposing said concave portion and being secured thereto when said cover is in the closed position.

5. A card adapter according to claim 1 wherein said positioning means comprises a block for positioning a first end of the IC card, and fist and second spaced ribs for holding the opposing end of said IC card.

6. A card adapter according to claim 5 wherein a shape of said block conforms to a shape of the first end of the IC card, and shapes of the fist and second ribs conform to shapes of corresponding corners of the opposing end of said IC card.

7. A card adapter according to claim 1 wherein a height of the card slot is substantially equal to the sum of a thickness of the cover, a thickness of the base and a thickness of the IC card.

8. A card adapter according to claim 1 further comprising a switch for activating the IC card and detecting an insertion of the card adapter in said card slot when the circuit board connector makes electrical contact with the receiving member connector.

9. A card adapter according to claim 8 further comprising a lock means for locking said cover in its closed position.

10. A card adapter according to claim 9 further comprising positioning means for positioning said IC card on the surface of said base.

11. A card adapter according to claim 9 wherein a height of the card slot is substantially equal to the sum of a thickness of the cover, a thickness of the base and a thickness of the IC card.

12. The method of connecting an IC card having card contacts on a surface thereof to an electronic apparatus having a receiving member, comprising the steps of:

placing the IC card on a surface of a base of a card adapter in contact with circuit board contacts of the card adapter, said card adapter having a cover;

closing the cover of said card adapter thereby bringing the card contacts into close electrical contact with the circuit board contacts;

inserting the card adapter into a card slot of the receiving member of the electronic apparatus thereby connecting the card contacts to the electronic apparatus; and positioning said IC card on the surface of said base.

13. The method according to claim 12 whereby the card contacts are connected to the electronic apparatus after a predetermined time delay.

* * * * *